US006556088B1

(12) United States Patent
Dietl et al.

(10) Patent No.: US 6,556,088 B1
(45) Date of Patent: Apr. 29, 2003

(54) PHASE-LOCKED LOOP HAVING A STABLE DAMPING FACTOR

(75) Inventors: Markus Dietl, München (DE); Hermann Seibold, Haag an d. Amper (DE)

(73) Assignee: Texas Instruments Deutschland, GmbH, Freising (DE)

( * ) Notice: Subject to any disclaimer, the term of this patent is extended or adjusted under 35 U.S.C. 154(b) by 0 days.

(21) Appl. No.: 09/689,111

(22) Filed: Oct. 12, 2000

(30) Foreign Application Priority Data

Oct. 15, 1999 (DE) .......................... 199 49 782

(51) Int. Cl.[7] ................................. H03L 7/00

(52) U.S. Cl. .................... 331/17; 331/175; 331/185; 331/57

(58) Field of Search ............................ 331/17, 185, 57, 331/175

(56) References Cited

U.S. PATENT DOCUMENTS 5,740,213 A * 4/1998 Dreyer ....................... 375/374

* cited by examiner

*Primary Examiner*—Arnold Kinkead
(74) *Attorney, Agent, or Firm*—William B. Kempler; W. James Brady; Frederick J. Telecky, Jr.

(57) ABSTRACT

A phase-locked loop (PLL) has a phase detector coupled to an output of the PLL and to a reference signal and a low pass filter including a first and a second charge pump coupled to an output of the phase detector. A capacitor is coupled to an output of the first charge pump, a first bias circuit coupled to the capacitor, the first bias circuit having a differential output. A voltage controlled ring oscillator has a plurality of differential inverter stages, each having a first input coupled to a first output of the first bias circuit and a second input coupled to a second output of the first bias circuit. A second bias circuit is coupled between the capacitor and the first bias circuit, an output of the second bias circuit being coupled to an input of the first bias circuit and to an output of the second charge pump. The PLL circuit exhibits a stable damping factor with respect to frequency.

7 Claims, 10 Drawing Sheets

PHASE-LOCKED LOOP HAVING A STABLE DAMPING FACTOR

BACKGROUND OF THE INVENTION

The invention relates in general to a phase-locked loop, more particularly to an integrated phase-locked loop (PLL), featuring a damping which is practically independent of the process quality condition of the integrated PLL circuit components, temperature as well as supply voltage functions and noise incurred by the substrate of the integrated circuit.

Phase-locked loops are used to set the frequency f of an oscillator so that it agrees with the frequency f0 of a reference oscillator without the phase shift between the two frequencies running away.

FIG. 1 shows the typical configuration of a known phase-locked loop. A phase detector 10 compares the phase of the PLL output signal f to that of the reference signal f0. Depending on whether the PLL output signal f leads or trails the reference signal of the phase detector outputs a signal UP or DOWN, prompting the charge pump 12 to apply or remove a charge to/from the low-pass filter 14. The low-pass filter 14 generates a control voltage Vs proportional to the phase shift, this control voltage being applied to a voltage-controlled oscillator (VCO). The VCO oscillates such that—where necessary in conjunction with an output frequency divider 18—a signal is output whose frequency varies in accordance with the VCO control voltage applied to the low-pass filter 14 and which in conclusion agrees with the frequency of the reference signal f0. Phase-locked loops of the type as shown in FIG. 1 in which a charge pump is employed read e.g. from the paper "Charge Pump Phase-Locked Loops" by Floyd M. Gardner in IEEE Transactions on Communications, Vol. COM-28, No. 11, Nov 1980.

In current increasingly fast digital circuitry ring oscillators are used preferably as PLL VCOs, these ring oscillators consisting of a cascaded series arrangement of identical inverter circuits with direct feedback of the output to the input. In this arrangement the oscillation frequency of the signal output by the ring oscillator depends on the transit time in the individual inverter stages which can be set via control voltages applied to the individual inverter stages which as a rule are not directly controlled by the output voltage of the PLL low-pass filter but by a special bias generator which receives the output voltage of the low-pass filter as the input voltage and generates therefrom one or more control voltages which are applied to the individual inverter stages to set the transit time of the individual inverter stages and thus the frequency of the VCO output signal.

FIG. 2 shows one such known circuit comprising a bias generator 20 and ring oscillator in which the bias generator 20 receives the input voltage Vc and generates therefrom the two control signals VBP and VBN which control the transit time in the three inverter differential stages 22, 24 and 26 of the ring oscillator and thus the frequency of the output signal of the ring oscillator. The output signal (UA1, UA2) of the ring oscillator is applied to the phase detector or a frequency divider where necessary in a further processed form. One such phase-locked loop including a ring oscillator and bias generator reads from the paper "Low-Jitter Process-Independent DLL and PLL Based on Self-Biased Techniques" by John G. Maneatis in IEEE JOURNAL OF SOLID-STATE CIRCUITS, Vol. 31, No. 11. November 1996, this paper being cited hereinafter as "Maneatis" for the sake of simplicity.

Maneatis describes a special inverter stage and a bias generator specially adapted thereto, the object of which is to reduce the dependencies of the VCO amplification factor K0 and thus the damping z and natural frequency vn on the process-inherent fluctuations in the parameters of the PLL circuit components, the temperature as well as on the fluctuations in the supply voltage and noise introduced by the substrate of the integrated circuit. The VCO amplification factor K0 is defined by the following equations:

$$K0 = \frac{dw}{dVs} \text{ or} \qquad (1a)$$

$$K0' = \frac{df}{dVs} \qquad (1b)$$

where f is the PLL output frequency, v is the corresponding angular frequency and Vs is the output voltage furnished by the low-pass filter in conjunction with the charge pump controlled by the phase detector (see FIG. 1).

FIG. 3 shows the inverter differential stage of the ring oscillator described in the cited Maneatis paper. Contained in each of the two branches in the inverter differential stage is a resistance RP and RN resp. each simulated by two PMOS FETs namely MPR1, MPR2 and MPR3, MPR4 resp., whose source/drain circuits are connected in parallel, one in each case (MPR1 and MPR4 resp.) being circuited as a diode whilst the other (MPR2 and MPR3 resp.) is gated by the bias voltage VBP. The resistances are connected to the differential outputs VAUSP and VAUSN resp. cascading the inverter differential stages, and to the source/drain circuit of the NMOS FETs MNS1 and MNS2 resp. acting as switches, receiving at each gate the input differential voltages VINN and VINP resp. from the preceding cascade inverter differential stage. The differential outputs VAUSP and VAUSN resp. are connected to the output capacitances CAUSP and CAUSN resp. defined by the gating surface of the NMOS FETs MNS1 and MNS2 resp. of the next inverter stage as well as by the length of the supply leads. Both branches of each inverter differential stage receive a current 2 Id furnished by a voltage-controlled current source made up of an NMOS FET MNIS gated by the bias voltage VBN. The bias voltages (=control voltages) VBP and VBN applied to each inverter differential stage of the ring oscillator are generated by the bias generator as shown in FIG. 5 to be explained later.

In operation of the inverter differential stage the switch MNS1 is periodically opened and closed, the switch MNS2 assuming the other switching condition every time. When e.g. MNS1 has just been closed, the capacitance CAUSP is charged until Id * RP=VAUSP where VAUSP is the voltage applied to the output VAUSP of the inverter differential stage. During this time the capacitance CAUSN is discharged until VAUSN=0 V. At the point of intersection of the voltages VAUSP and VAUSN the switching position of the switches MNS1, MNS2 of the next inverter differential stage changes so that the transit time td of each inverter differential stage is given by $$td = Reff * Ceff * ln2 \qquad (2)$$

where Reff is the resistance of Rp and Rn resp. and Ceff corresponds to the capacitances CAUSN and CAUSP.

The frequency f of the ring oscillator is then given by the following $$f = \frac{1}{2*n*td} = \frac{1}{2*n*Reff*Ceff*ln2} \quad (3)$$

where n is the number of inverter differential stages of the ring oscillator.

FIG. 4 shows how a linear resistance is simulated for two different control voltages VBP (1.75 V and 2.5 V) by the two PMOS FETs of the "symmetrical" resistances RP and RN resp. in passing through the voltage difference "supply voltage (Vdd)—VBP" during an oscillation of the output voltage of an inverter stage. In this arrangement-the I/U characteristic is not linear, it instead being symmetrical about the point (VBP/2, Id) dividing the straight line connecting the origin and the point (VBP, 2Id) of the I/U in the middle. In this arrangement at VBP, 2Id a so-called effective resistance Reff materializes which describes the resistance effective for the oscillation of the oscillator stage and is given by:

$$\text{Reff} = nc*RPMOS(VBP) \quad (4)$$

where RPMOS(VBP) is the resistance resulting from the local slope of the I/U curve at the point VBP/2Id and nc is a correction factor describing the ratio of RPMOS(VBP) to Reff. The principle of "symmetrical" resistances is likewise explained in Maneatis.

For the principle of "symmetrical" resistances to function the bias generator needs to set the bias voltage VBN of the current sources formed by the MOS FETs MNIS so that an inverter stage current 2Id always materializes which biases the lower limit of the voltage swing executed by the output voltage of the inverter stages to VBP, i.e. that the circuit point 40 as indicated in FIG. 4 is always held at the voltage Vc furnished by the low-pass filter capacitor, this voltage corresponding to the second control voltage VBP furnished by the bias generator. The delay of the inverter differential stages can then be set by the applied control voltage VBP since the effective resistance then changes linearly with the control voltage VBP. In this arrangement the current of the current source MNIS is set so that the output voltage swing of the inverter differential stages varies with the control voltage VBP so that the point-symmetrical I/U characteristic of the resistance, furnishing the desired linear relationship between VBP and Reff can be maintained. It is these symmetrical resistances that ensure the circuit is hi y independent of substrate noise and fluctuations in the supply voltage.

Maneatis describes also a bias generator as shown in FIG. 5 which generates the bias voltages VBP and VBN. In this arrangement the main function of the bias generator is to set the bias voltage VBN of the VCO current source identified as MNIS in FIG. 3 so that the current source furnishes an inverter stage current 2Id at which the voltage swing of the oscillator inverter stages is limited downwards by the voltage Vc (=VBP) for the principle of the symmetrical resistance as described effective for the oscillation of the inverter stages to function at all. This task is handled by a differential amplifier 50 in the bias generator as shown in FIG. 5 (a bias generator 52 being provided at the input of the differential amplifier) in conjunction with a copy of half an inverter differential stage 54 of the ring oscillator. In this arrangement the differential amplifier 50 sets VBN so that the voltage at the circuit point 58 equals the control voltage Vc furnished by the low-pass filter capacitor C. When e.g. the supply voltage Vdd changes, the differential amplifier 50 reacts so that the voltage swing of the inverter differential stages of the ring oscillator is maintained constant, as a result of which the delay and thus the frequency of the ring oscillator is independent of the fluctuations in the supply voltage. The bias generator furnishes in addition via the Vc buffer stage 56 a "buffered" copy VBP of the output voltage Vc of the low-pass filter capacitor at its second output. In this arrangement the Vc buffer stage is made up of a further copy of half an inverter differential stage of the ring oscillator, whereby in this case only the second PMOS also of the resistance is likewise connected as a diode. Since in this case too, the current source is controlled by the second bias voltage the circuit point connecting the drains of the two PMOS FETs also has the voltage Vc so that from here a voltage corresponding to the voltage Vc can be furnished. Due to the Vc buffer stage the control voltage Vc furnished by the low-pass filter capacitor is decoupled capacitively from the inverter stages. Furthermore, it is required that the Vc buffer stage takes over the function of the resistance of the low-pass filter in the Maneatis phase-locked loop, which will now be detained and which poses problems.

When k is the amplification factor of one of the PMOS FETs and Id is the drain current of one of the PMOS FETs then the effective resistance Reff is given by $$Reff = \frac{nc}{\sqrt{2 \cdot k \cdot Id}} \quad (5)$$

With the aid of the MOS equation:

$$Id = \frac{k}{2}(Vs - Vth)^2 \quad (6)$$

in which Vth is the threshold voltage of the MOSFET and a defined total capacitance Cb $$Cb = Ceff*n*2 \quad (7)$$

the amplification factor K0" of the ring oscillator results from the equations 1b, 3, 5, 6 and 7 (and assuming nc=constant as well as k=constant)

$$K0' = \frac{k}{ln2 \cdot nc \cdot Cb} \quad (8)$$

where nc and k and thus also K0 depend on Vc (i.e. the PLL operating frequency), the semiconductor fabrication process and the ambient temperature.

To reduce the fluctuations in the PLL closed loop transfer function, the damping z and ratio of natural frequency to operating frequency wn/wref of the phase-locked loop Maneatis further proposed configuring the charge pump of the phase-locked loop likewise in accordance with half inverter differential stages of the ring oscillator so that the charge pump current Ip has a special relationship x to the current 2 Id of the current source of the inverter differential stages as expressed by $$Ip = 2*x*Id \quad (9)$$

In addition, Maneatis proposed for the same reasons selecting the resistance of the PLL low-pass filter so that its resistance value is proportional to the inverse value of the root of the inverter differential stage current 2 Id (and thus of the charge pump current Ip). For this purpose he proposed dividing the capacitor and the resistor of the low-pass filter into two separate current branches which will now be explained with reference to FIG. 6.

FIG. 6 shows on the left a low-pass filter 60 made up of a series connection of a resistor R and a capacitor C. Charging and discharging the capacitor is done via the charge pump controlled by the phase detector output signals, the charge pump furnishing the current Ip. Materializing at the output of the low-pass filter is the voltage Vs corresponding to the sum of the voltages at the resistor R and capacitor C. Maneatis now proposes generating the voltages at the resistor R and capacitor C separate in two current paths 62 and 64 fed by charge pumps which are the same (controlled by the phase detector output signals). When in this arrangement the second current path 64 containing the resistor R of the low-pass filter is controlled by a voltage-controlled voltage source 66 which generates a copy of the voltage resulting at the capacitor C of the current path 62, then a voltage Vs materializes at the output 68 of the second current path 64 which corresponds to the output voltage of the low-pass filter of the current path 60.

One simple way of achieving such a resistance according to Maneatis is to attach a circuit configured according to half an inverter differential stage of the ring oscillator, in which the two PMOS transistors are circuited as diodes, to the output of the bias generator, as evident from FIG. 5 (Vc buffer stage). The Vc buffer stage as shown in FIG. 5 at the output of the bias generator is said to assume in the Maneatis phase-locked loop the function of the resistor of the PLL low-pass filter.

The resistor R of the low-pass filter relates to the resistance of the oscillator inverter stages by the factor y as expressed by the following equation in which 2 gm is the conductivity of the two PMOS FETs of the inverter differential stage when the output voltage of the inverter differential stage VBP corresponds to $$R = \frac{y}{2\,gm} = \frac{y}{2 \cdot \sqrt{2 \cdot k \cdot Id}} \quad (10)$$

FIG. 7 shows in conclusion the complete phase-locked loop proposed by Maneatis in the aforementioned paper, wherein reference numeral 70 identifies the branch of the PLL low-pass filter containing the capacitor C, reference numeral 72 identifying the bias generator generating the two control voltages VBP and VBN and reference numeral 78 identifying an optional frequency divider which divides the output voltage of the VCO, symbolized in this case by the corresponding voltage V, by the factor N. VBN is used not only to control the current sources of the inverter differential stages of the VCO 74 but also the current sources in the charge pumps 1 and 2 configured analogously (see arrows 76 and 77 resp.), it thus involving a self-biased PLL.

The Maneatis proposal is to attach the second charge pump to the output of the bias generator outputting the control voltage VBP. This results in two different factors KBP and K0 for the capacitor C of the low-pass filter and resistor R of the low-pass filter resp. in the mathematical closed loop representation of the phase-locked loop as shown in FIG. 8 and corresponds to the circuit as shown in FIG. 7, where K0 is given by the equation (1) (a) and KBP by the following equation:

$$KBP = \frac{d\omega}{dVBP} \quad (11)$$

where KBP corresponds to K0 (VBN=constant; VBP variable), i.e. K0 on the condition that VBN is maintained constant. However, KBP varies strongly as a function of the frequency f. As deduced from the following the damping factors and the bandwidths of the phase-locked loop proposed by Maneatis fluctuate very heavily as a function of the oscillation frequency, the temperature and the semiconductor fabrication process of the components forming the phase-locked loop (MOS-FETs).

Otherwise in FIG. 8:

f0 reference frequency

Pref reference phase

Psys actual phase of the PLL output signal dP phase difference detected by phase detector, i.e. dP=Pref−Psys, Ip current of charge pumps 1 and 2, and s Laplace operator.

In the Laplace representation the following equation materializes for the mathematical closed loop model as shown in FIG. 8:

$$(Pref(s) - Psys(s)) \cdot \frac{Ip}{2 \cdot \pi} \cdot \left( \frac{K0}{s \cdot C} + R \cdot KBP \right) \cdot \frac{1}{s} = Psys(s) \quad (12)$$

Furthermore, the equations (9) and (10) are needed hereinafter.

With the aid of the transfer function H(s) of the closed loop $$H(s) = \frac{Psys(s)}{Pref(s)} \quad (13)$$

and the equation for a PLL system of the 2nd order:

$$H(s) = \frac{2 \cdot \zeta \cdot \omega n \cdot s + \omega n^2}{s^2 + 2 \cdot \zeta \cdot \omega n \cdot s + \omega n^2} \quad (14)$$

the damping factor z characterizing the transient response of the closed loop is given, with the aid of the above equations, by $$\zeta = \frac{y}{4} \sqrt{\frac{x \cdot C \cdot KBP^2}{2 \cdot \pi \cdot K0 \cdot k}} \quad (15)$$

It is evident that the damping factor z greatly depends on the factor KBP which in turn is a function of the frequency.

The followings Tables 1 and 2 list simulated values for the damping factor z for various process conditions (abbreviated: process) of the MOS transistors and various temperatures for an operating frequency of 66 MHz (Table 1) and 200 MHz (Table 2) resp., where C was selected= 2.500 E-10 F, x=0.67 and y=1.72.

TABLE 1

| Process | good | good | poor | poor |
| --- | --- | --- | --- | --- |
| Temperature | 0³ C. | 85³ C. | 0³ C. | 85³ C. |
| Frequency | 66 MHz | 66 MHz | 66 MHz | 66 MHz |
| VBP/V | −0.88 | −0.85 | −0.966 | −0.936 |
| Id/μA | 23.5 | 22.9 | 27.3 | 27.0 |
| gm/Ω⁻¹ | 2.12 E-04 | 1.71 E-04 | 2.01 E-04 | 1.63 E-04 |
| KBP MHz/V | 130 | 108 | 120 | 97 |
| K0' MHz/V | 720 | 540 | 510 | 380 |
| k/A/V² | 9.56 E-04 | 6.38 E-04 | 7.40 E-04 | 4.92 E-04 |
| ζ | 0.87 | 1.02 | 1.09 | 1.25 |

TABLE 2

| Process | good | good | poor | poor |
|---|---|---|---|---|
| Temperature | 0³ C. | 85³ C. | 0³ C. | 85³ C. |
| Frequency | 200 MHz | 200 MHz | 200 MHz | 200 MHz |
| VBP/V | −1.071 | −1.105 | −1.229 | −1.291 |
| Id/µA | 82.5 | 88.8 | 104 | 115 |
| gm/Ω⁻¹ | 3.87 E-04 | 3.31 E-04 | 3.70 E-04 | 3.22 E-04 |
| KBP MHz/V | 268 | 194 | 184 | 161 |
| K0' MHz/V | 720 | 540 | 510 | 380 |
| k/A/V² | 9.08 E-04 | 6.17 E-04 | 6.56 E-04 | 4.50 E-04 |
| ζ | 1.84 | 1.87 | 1.77 | 2.17 |

As evident from Tables 1 and 2 the damping factor z for the various starting conditions (semiconductor fabrication process, temperature, frequency conditions) does not remain constant, it instead becoming almost tripled between the two extreme conditions (good process 0³C, 66 MHz) and (poor process, 85³C, 200 MHz) resp. from 0.87 to 2.17.

SUMMARY OF THE INVENTION

It is thus an object of the present invention to define a new phase-locked loop which as compared to the phase-locked loop developed and as described above by Maneatis has the improvement of resulting in a damping factor z which has an enhanced stable response to fluctuations in the semiconductor fabrication process of the PLL components, temperature and operating frequency.

This object is achieved by a phase-locked loop comprising

- a phase detector which compares the phase angle of a PLL output signal with that of a reference signal and outputs an error signal characterizing the phase shift between the PLL output signal and the reference signal;
- a charge pump mechanism connected to the phase detector, the mechanism supplying/removing a charge to/from the low-pass filter connected to the charge pump mechanism in response to the error signal so that the low-pass filter generates a control voltage corresponding to the phase shift;
- a voltage-controlled ring oscillator furnishing a PLL output signal, the ring oscillator having several inverter differential stages, each of which comprises two differential paths (=half inverter stages) each comprising a resistance controlled by a first bias voltage corresponding to the control voltage and simulated by one or more transistors, an output capacitance, a differential input and a differential output, both differential paths being fed by a common current source which is controlled by a second bias voltage; and
- a bias generator receiving the control voltage of the low-pass filter and generating therefrom the second bias voltage such that the current of the current source of the inverter stages is set in each case so that the simulated resistance is varied linearly by the control voltage; the output of the bias generator furnishing the first bias voltage comprising an output impedance acting in response to the resistance of the half inverter stages; and
- the low-pass filter including the charge pump mechanism comprising a first charge pump controlled by the phase detector, a low-pass filter capacitor connected to the first charge pump and a further circuit receiving the output signal of the low-pass filter capacitor, the configuration of the circuit corresponding to that of the bias generator, the output impedance of the output of the further circuit furnishing the first bias voltage forming the low-pass filter resistance and this output being connected to a second charge pump corresponding to the first charge pump and controlled by the phase detector and to the input of the bias generator.

Advantageous further embodiments of the invention are characterized in the sub-claims.

The enhanced damping factor z is achieved in the invention by the low-pass filter of the phase-locked loop being better modulated than that of the Maneatis PLL by two charge pumps, a capacitor and a further circuit corresponding to the bias generator.

BRIEF DESCRIPTION OF THE DRAWINGS

The invention will now be detailed by way of an example as shown in the drawing in which.

DETAILED DESCRIPTION OF PREFERRED EMBODIMENT

Figure 9:
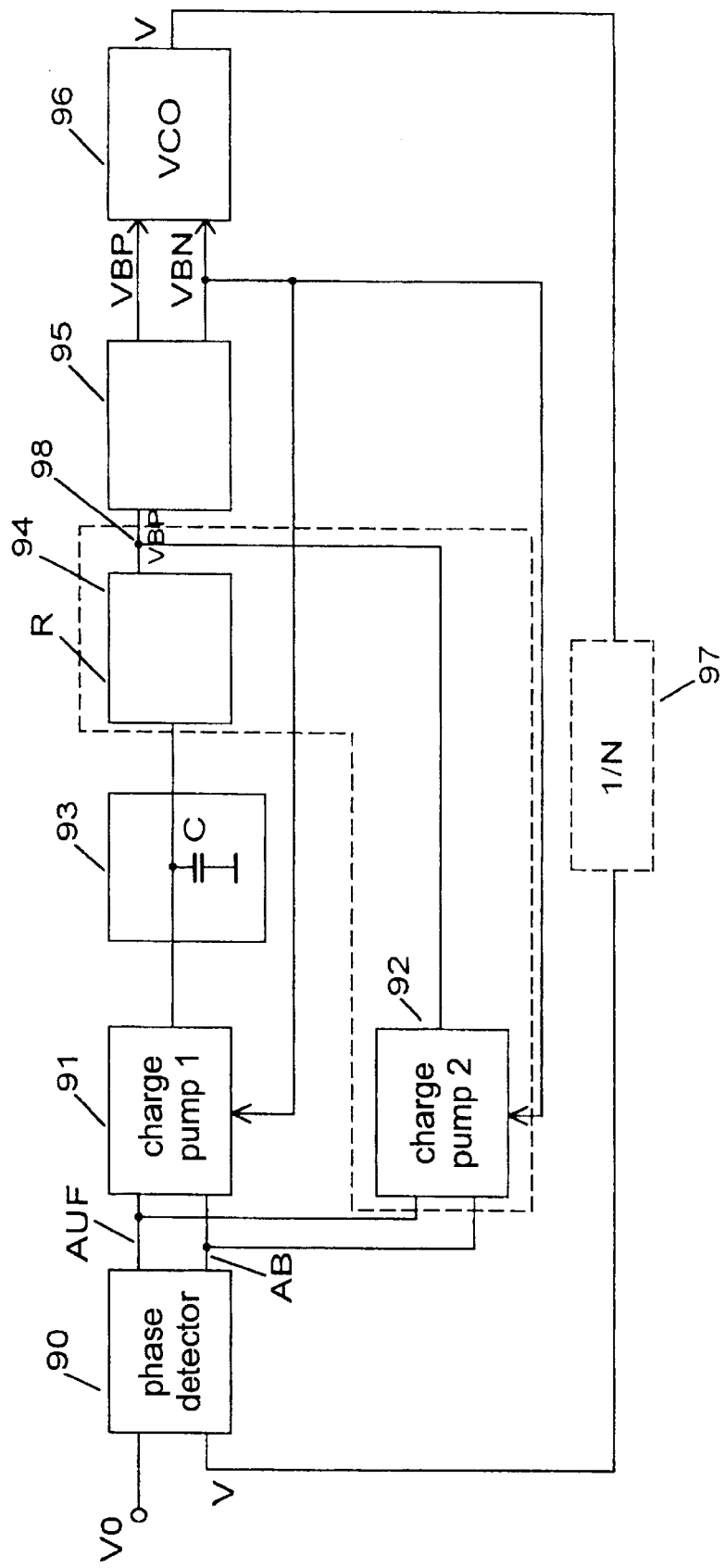
FIG. 9 is a block diagram of a preferred embodiment of a Phase-locked loop in accordance with the invention.

Referring now to FIG. 9 there is illustrated a preferred embodiment of a phase-locked loop in accordance with the invention, the circuit configuration of which is similar to that of the Maneatis PLL as described above, whereby the differences are highlighted by the broken-lines boxing the circuit components 92 and 94.

A phase detector 90 compares the phase angle of a PLL output signal with a specific frequency f, symbolized in this case by the voltage V, to that of a reference signal V0 symbolizing a reference frequency f0 and outputs UP and DOWN error signals which activate the charge pumps 91 and 92 so that they furnish or remove a charge. The charge pumps 91 and 92 form together the charge pump of a low-pass filter which is detailed below.

Figure 1:
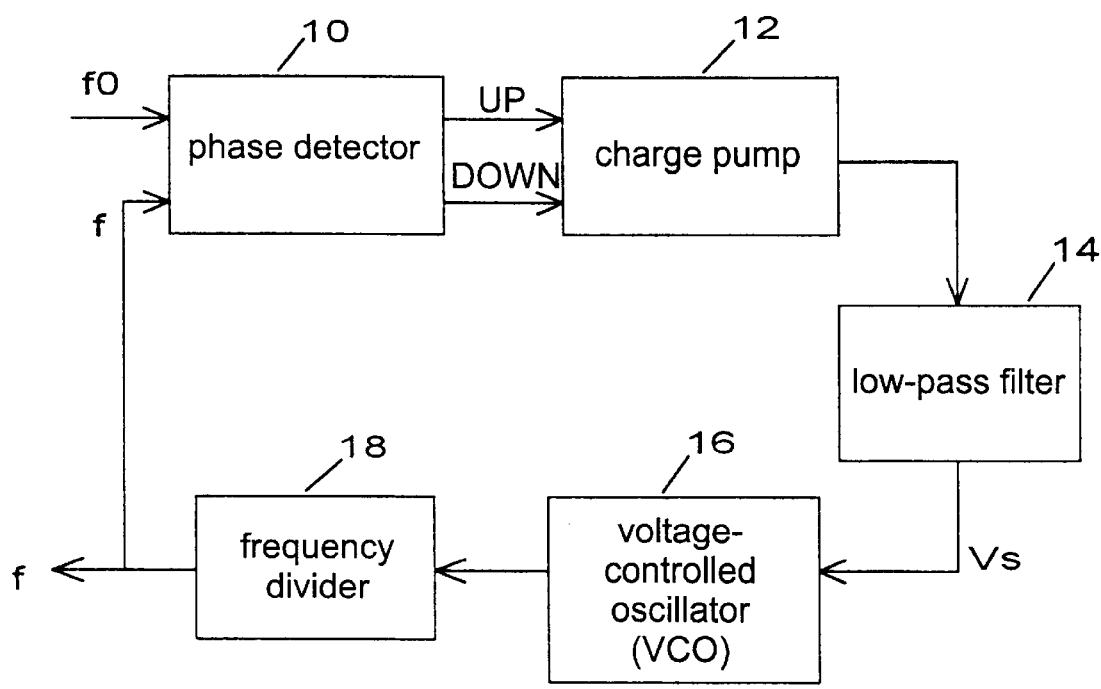
FIG. 1 is a block diagram of a prior art phase-locked loop.
Figure 2:
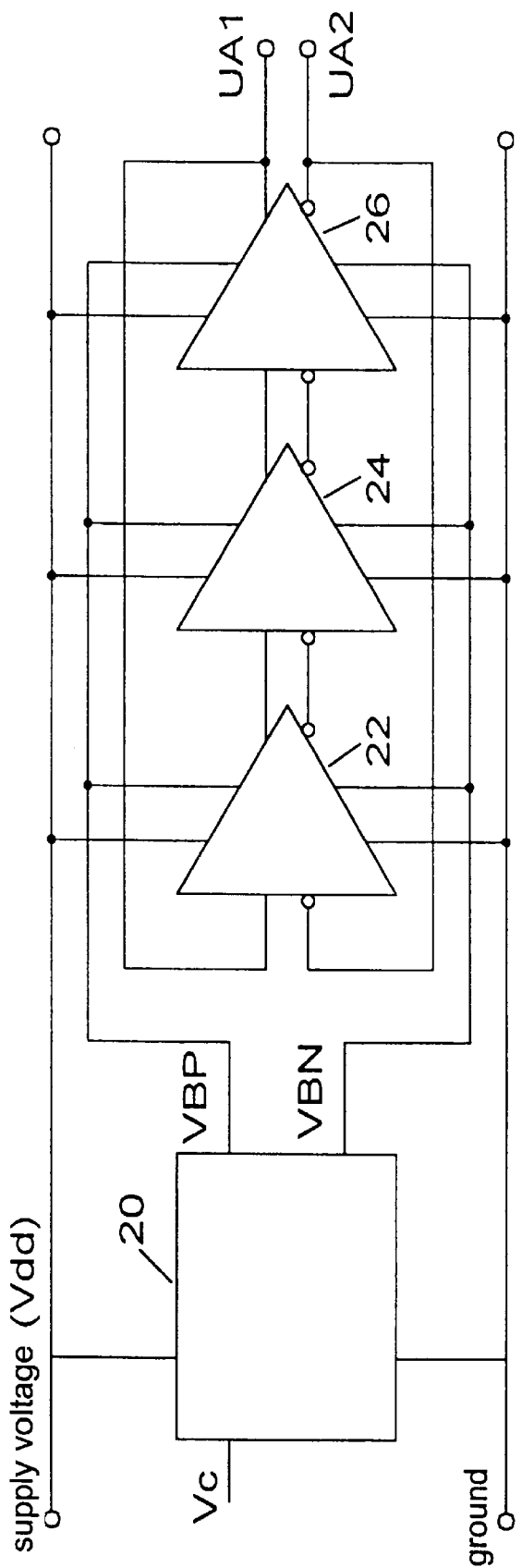
FIG. 2 is a circuit diagram of a ring oscillator including a ring oscillator bias generator as used in a known phase-locked loop.
Figure 3:
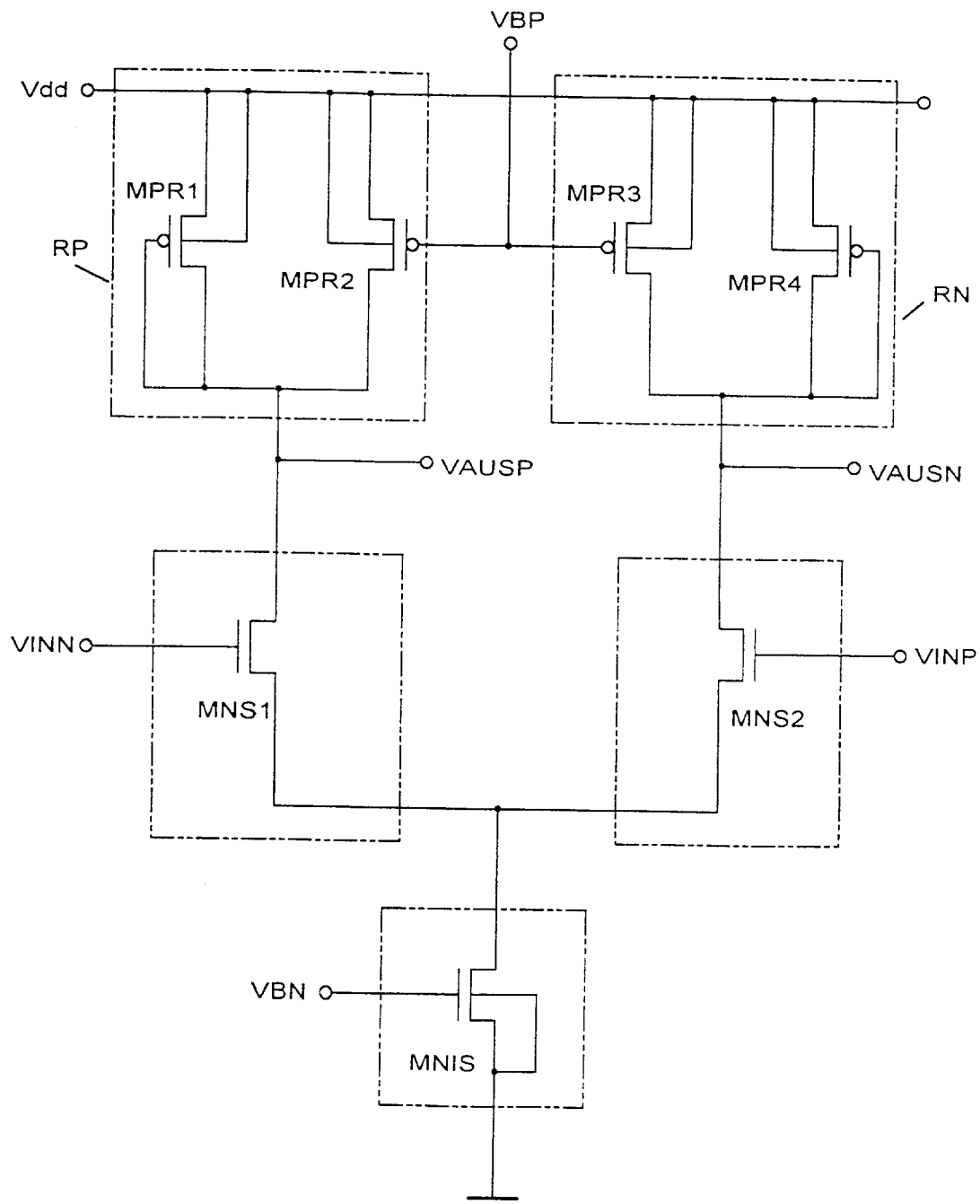
FIG. 3 is a prior art inverter differential stage used in a known ring oscillator.
Figure 4:
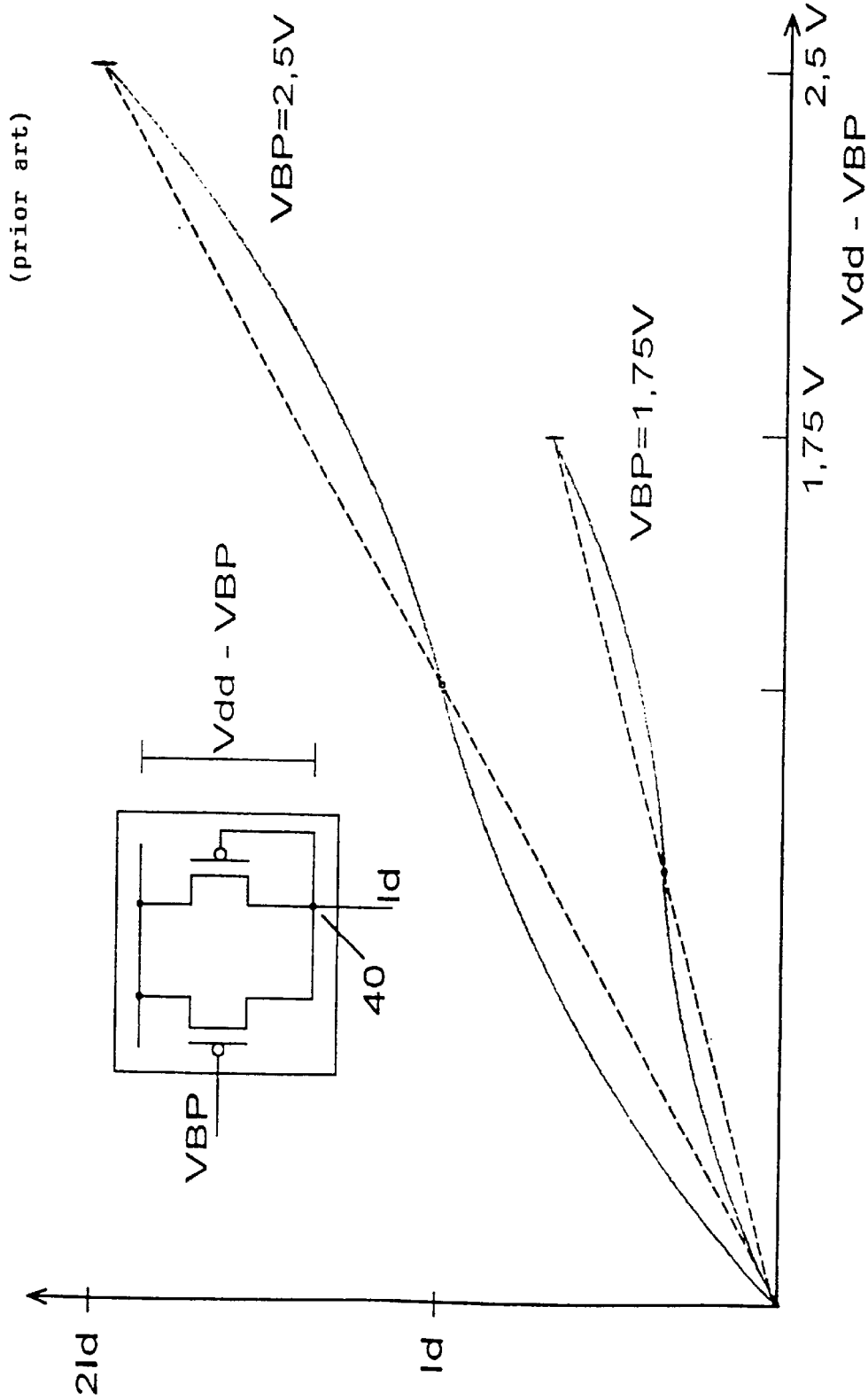
FIG. 4 are plots of U/I characteristics of the symmetrical resistances materializing in the inverter differential stage as shown in FIG. 3 during oscillation of the inverter differential stage.

The VCO of the phase-locked loop in accordance with the invention is a ring oscillator in accordance with FIG. 2, whose individual inverter differential stages are configured corresponding to the circuit diagram as shown in FIG. 3 and as described above, i.e. inverter differential stages containing 2 each "symmetrical" resistances made up of 2 PMOS FETs and are controlled by two bias voltages VBP and VBN. the first bias voltage VBP being applied to the gates of the PMOS FETs of a inverter differential stage not connected as a diode and the second bias voltage VBN controls the current source MNIS of the inverter differential stages. For more details reference is made to the background description.

Figure 5:
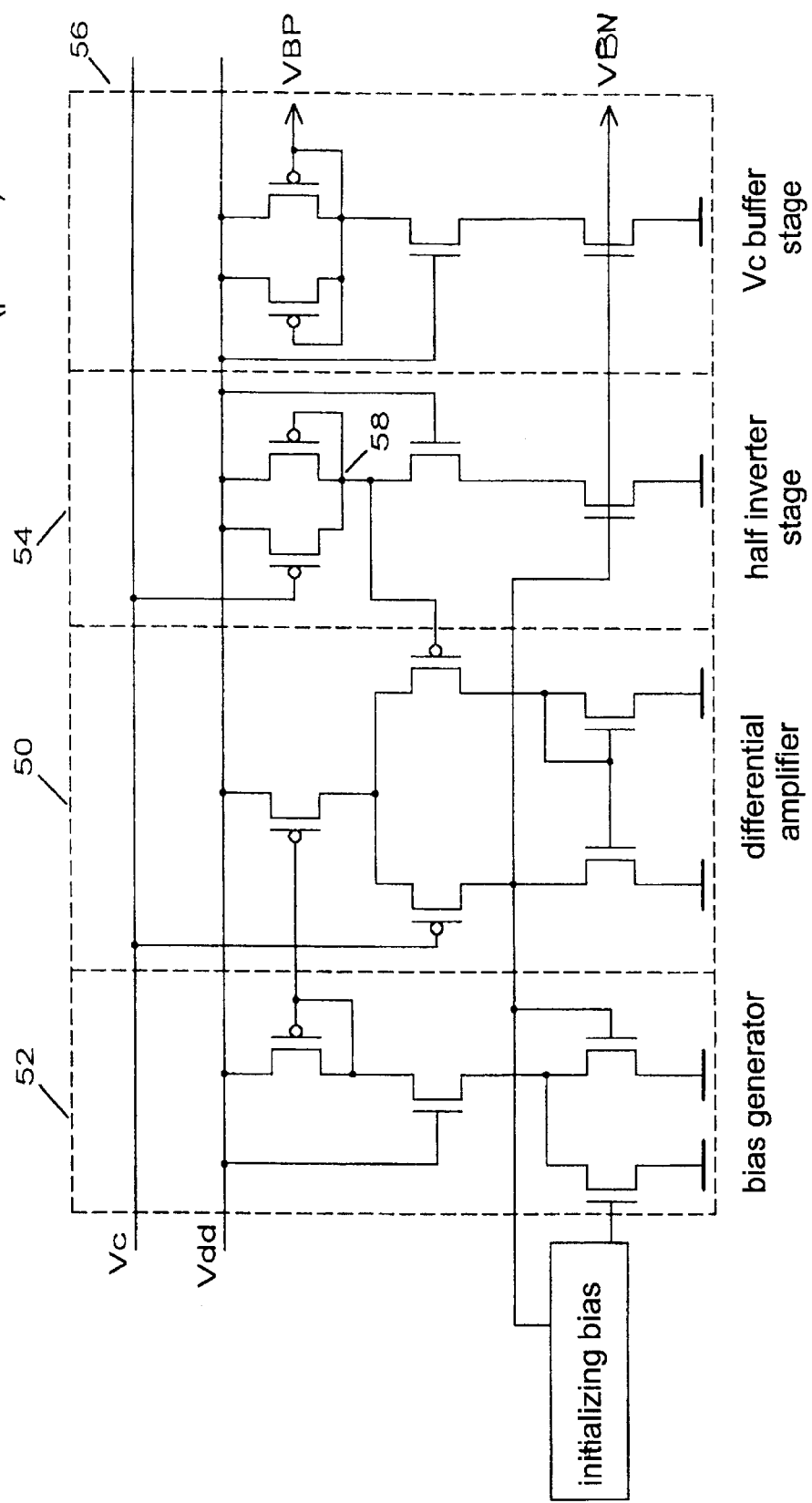
FIG. 5 is a prior art bias generator used in conjunction with the inverter differential stage as shown in FIG. 3.

The phase-locked Loop in accordance with the invention and shown in FIG. 9 includes further a bias generator 95 which generates the two bias voltages VBN and VBP and passes them on to the individual inverter differential stages of the ring oscillator 96. The bias generator 95 is configured preferably in accordance with the bias generator as shown in FIG. 5 and as described above.

Optional the phase-locked loop in accordance with the invention may contain a frequency divider 97 which divides the oscillation frequency furnished by the VCO by a suitable factor 1/N. For the sake of simplicity it is assumed hereinafter that N=1.

Figure 6:
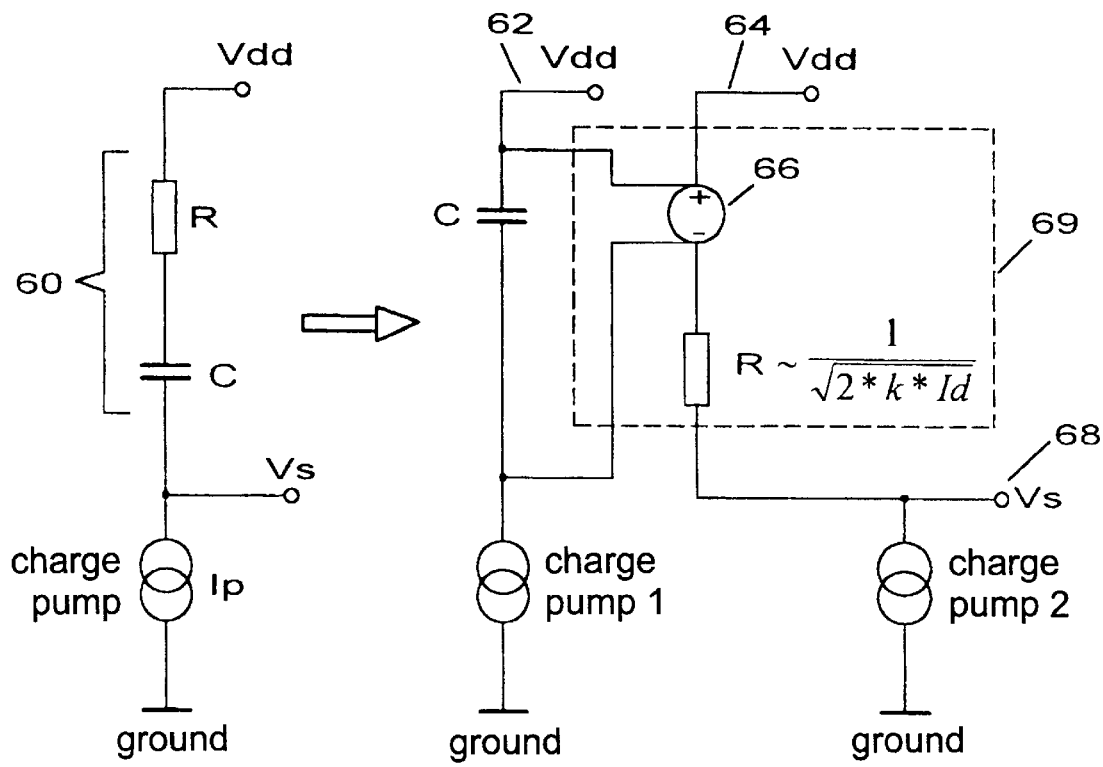
FIG. 6 are several current branches showing a prior art principle of simulating a low-pass filter used in a known phase-locked loop simulated by two separate current paths each having a capacitor and a resistor resp. and own charge pump 1 and 2 resp.
Figure 7:
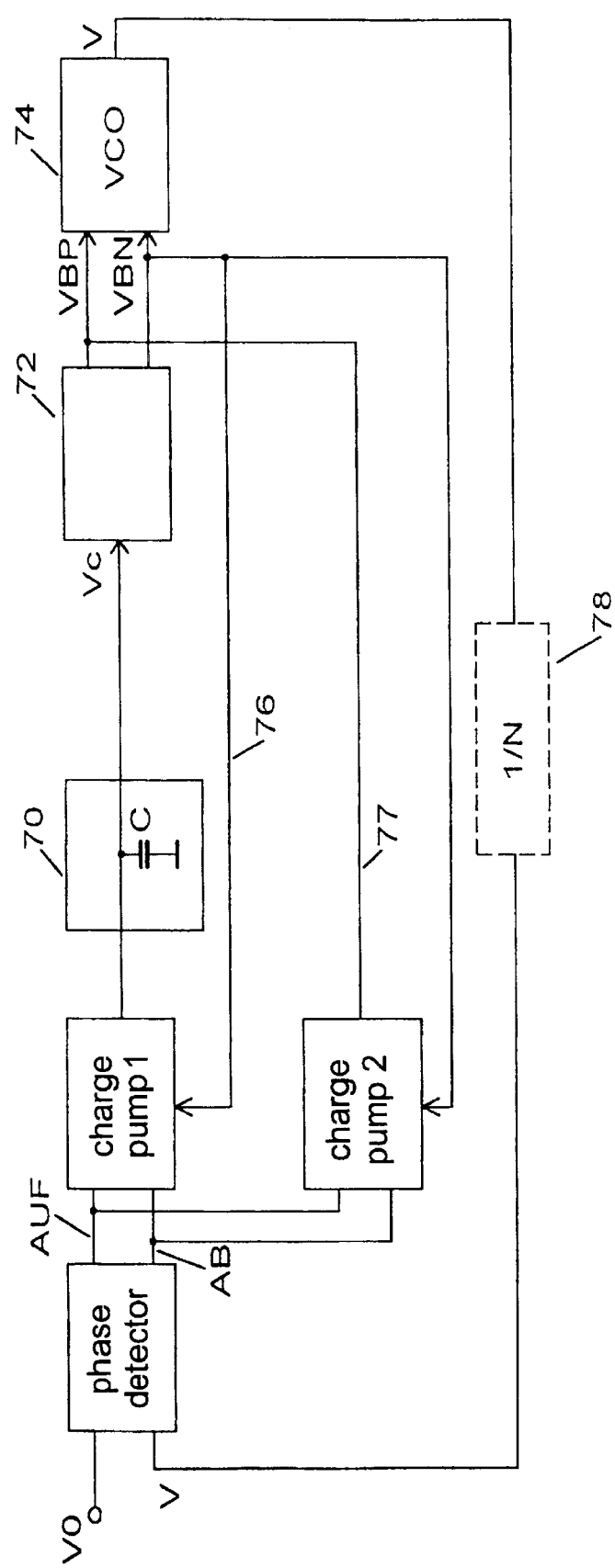
FIG. 7 is a block diagram of a prior art phase-locked loop using the bias generator as shown in FIG. 5.

The circuit components: 91, 92, 93 and 94 as shown in FIG. 9 simulate the low-pass filter and the associated charge pump mechanism of the phase-locked loop in accordance with the invention. In this arrangement the low-pass filter 60 shown on the left in FIG. 6 and comprising a series circuit of a resistor R and a capacitor C to which a charge pump is attached with a current Ip is modulated by two separate current branches 62 and 64. The first current branch 62 is simulated by the low-pass filter capacitor C identified in FIG. 9 by the reference numeral 93 and the charge pump 1 attached thereto and controlled by the phase detector 90. The second current branch 64 receives the voltage applied to the capacitor 93 (see voltage-controlled current source identified by the reference numeral 66 in FIG. 6) and comprises a low-pass filter resistor R which is modulated by a circuit 94 in accordance with the phase-locked loop in accordance with the invention as shown in FIG. 9, the configuration of the circuit 94 corresponding to that of the bias generator 95 (see in this respect FIG. 5), whereby attached to the output of the circuit 94 at which the voltage VBP is generated, is a second charge pump 2 the current of which corresponds to that of the charge pump 1. Both charge pumps consist, as described above in conjunction with the Maneatis circuit, of half inverter stages of the ring oscillator 96, whereby the current sources of the charge pumps are controlled by the control voltage VBN generated by the bias generator 95.

The second output of the circuit 94 corresponding to the bias generator furnishing a second bias voltage VBN is not used. To equivalently take into account the dependencies of the components on the semiconductor fabrication process the circuit 94 should be identical to the bias generator 95.

Figure 10:
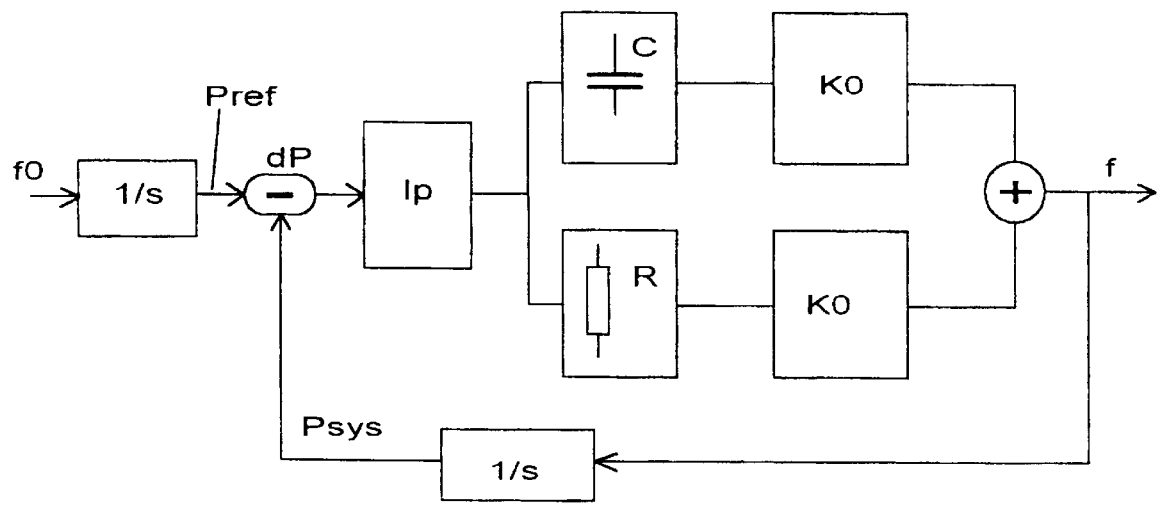
FIG. 10 is a mathematical closed loop model of the known phase-locked loop as shown in FIG. 9.

Referring now to FIG. 10 there is illustrated a mathematical closed loop model of the phase-locked loop in accordance with the invention as shown in FIG. 9 on the basis of which it will now be explained how the second circuit 94 corresponds to the bias generator in conjunction with the second charge pump 94 affects the damping factor z of the phase-locked loop in accordance with the invention.

Figure 8:
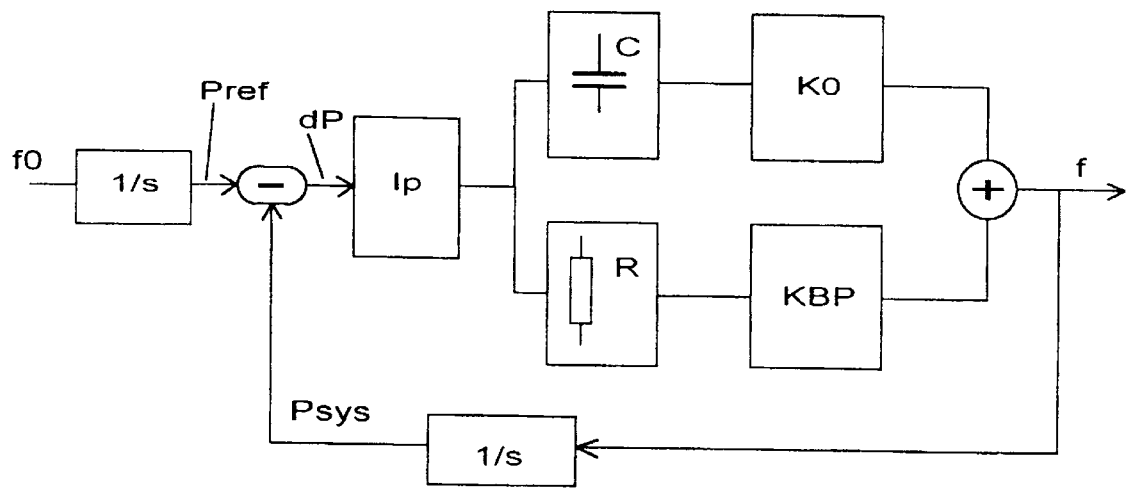
FIG. 8 is a mathematical closed loop model of the known phase-locked loop as shown in FIG. 7.

The reference numerals selected in FIG. 10 correspond to those as selected in FIG. 8 and as described above and are thus not detained hereinafter. Unlike the arrangement as shown in FIG. 8 now the same factor KO (see equation (1) (a)) acts on both the low-pass filter capacitor C and on the low-pass filter resistance R.

In the Laplace representation the following equation materializes for the mathematical closed loop model as shown in FIG. 10:

$$(Pref(s) - Psys(s)) \cdot \frac{Ip}{2 \cdot \pi} \cdot \left( \frac{K0}{s \cdot C} + R \cdot K0 \right) \cdot \frac{1}{s} = Psys(s) \quad (16)$$

from which with the aid of the above equations (9), (10), (13) and (14) the damping factor z of the phase-locked loop is $$\zeta = \frac{y}{4} \sqrt{\frac{x \cdot c \cdot K0}{2 \cdot \pi \cdot k}} \quad (17)$$

whereby the damping factor depends substantially only on K0 and k. When selecting e.g. C=2,200 E-10; x=0.67; y=0.4 then practically constant damping factors z materialize as evident from the following Tables 3 and 4 for different temperatures, different operating frequencies and different quality conditions of the semiconductor fabrication process (indicated abbreviated in the Tables with "process"). The fluctuations in the damping factors z is of the order of approx. 10% representing a substantial improvement over prior art (Maneatis, see Tables 1 and 2 above) in which for similar conditions fluctuations of almost 300% materialized.

TABLE 3

| Process | good | good | poor | poor |
|---|---|---|---|---|
| Temperature | 0³ C. | 85³ C. | 0³ C. | 85³ C. |
| Frequency | 66 MHz | 66 MHz | 66 MHz | 66 MHz |
| VBP/V | −0.927 | −0.907 | −1.027 | −1.011 |
| Id/μA | 34.8 | 33.9 | 41.0 | 40.7 |
| gm/Ω⁻¹ | 2.59 E-04 | 2.10 E-04 | 2.44 E-04 | 1.99 E-04 |
| K0' MHz/V | 538 | 401 | 384 | 293 |
| k/A/V² | 9.68 E-04 | 6.47 E-04 | 7.27 E-04 | 4.88 E-04 |
| ζ | 0.93 | 0.98 | 0.90 | 0.96 |

TABLE 4

| Process | good | good | poor | poor |
|---|---|---|---|---|
| Temperature | 0³ C. | 85³ C. | 0³ C. | 85³ C. |
| Frequency | 200 MHz | 200 MHz | 200 MHz | 200 MHz |
| VBP/V | −1.176 | −1.242 | −1.375 | −1.475 |
| Id/μA | 128 | 141 | 165 | 183 |
| gm/Ω⁻¹ | 4.67 E-04 | 4.06 E-04 | 4.48 E-04 | 3.94 E-04 |
| K0' MHz/V | 538 | 401 | 384 | 293 |
| k/A/V² | 8.50 E-04 | 5.86 E-04 | 6.07 E-04 | 4.25 E-04 |
| ζ | 0.99 | 1.03 | 0.99 | 1.03 |

It will readily be appreciated by the person skilled in the art that the phase-locked loop in accordance with the invention may, of course, differ in its components also from the circuit as shown in FIG. 9 and as described above without departing from the gist of the invention.

Thus, the inverter differential stage of the ring oscillator may differ from the Maneatis version, it merely being important that it is an inverter differential stage comprising a resistance simulated by one or more transistors, controlled by a first bias voltage, an output. capacitance, a differential input and a differential output, whereby both differential paths are fed from a common current source controlled by a second bias voltage.

The bias generator too, may also, of course, differ from the type as shown in FIG. 5. Sufficient is a circuit receiving the control voltage of the low-pass filter and generating therefrom the second bias voltage such that the current of the current source of the inverter stages is set in each case so that the resistance simulated by the transistors varies linearly with the control voltage to produce a linear relationship between the delay of the inverter and the control voltage. The output of the bias generator furnishing the first bias voltage needs to comprise an output impedance which responds in conforming with the resistance of the half inverter stage.

What is claimed is:

1. In a phase-locked loop (PLL) having a phase detector coupled to an output of the PLL and to a reference signal, a low pass filter comprising a first and a second charge pump coupled to an output of the phase detector, a capacitor coupled to an output of the first charge pump, a first bias circuit coupled to the capacitor, the first bias circuit having a differential output, a voltage controlled ring oscillator having a plurality of differential inverter stages, each having a first input coupled to a first output of the first bias circuit and a second input coupled to a second output of the first bias circuit, the improvement comprising:

a second bias circuit coupled between the capacitor and the first bias circuit, an output of the second bias circuit being coupled to an input of the first bias circuit and to an output of the second charge pump, the PLL circuit having a stable damping factor with respect to frequency.

2. The phase-locked loop of claim 1 wherein the second bias circuit generates said second bias voltage by means of a differential amplifier and a half inverter stage.

3. The phase-locked loop of claim 2 wherein the first bias circuit comprises at the output half inverter stage, having one or more transistors which form output impedance of the bias circuit.

4. The phase-locked loop of claim 1 wherein the inverter stage each comprises two PMOS FETs, one of which is connected as a diode and the other receiving the first bias voltage at its gate.

5. The PLL of claim 1 wherein the first and second bias circuits are identical, a second output of the second bias circuit being unused.

6. The PLL of claim 1 wherein the first and second charge pumps each comprise half inverter stages, each receiving a control signal from one of the first and second outputs of the first bias circuit.

7. The PLL of claim 5 wherein the first and second charge pumps each comprise half inverter stages, each receiving a control signal from one of the first and second outputs of the first bias circuit.

* * * * *